United States Patent
Duan et al.

(10) Patent No.: US 8,334,458 B2
(45) Date of Patent: Dec. 18, 2012

(54) GROUNDING MECHANISM FOR SLIDE-TYPE ELECTRONIC DEVICES

(75) Inventors: Chao Duan, Shenzhen (CN); Chia-Hua Chen, Taipei (TW)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 266 days.

(21) Appl. No.: 12/844,975

(22) Filed: Jul. 28, 2010

(65) Prior Publication Data

US 2011/0266018 A1 Nov. 3, 2011

(30) Foreign Application Priority Data

Apr. 28, 2010 (CN) .......................... 2010 1 0158324

(51) Int. Cl.
  *H05K 5/02* (2006.01)
  *H05K 5/00* (2006.01)
  *H01H 9/02* (2006.01)
(52) U.S. Cl. ......... 174/51; 174/53; 174/54; 361/679.01; 361/679.02; 361/679.03; 361/679.04

(58) Field of Classification Search ............ 361/679.01, 361/679.02, 679.08, 679.09, 679.3, 679.55–679.59, 361/756–759; 174/535, 51–55
See application file for complete search history.

(56) References Cited

U.S. PATENT DOCUMENTS

| | | | |
|---|---|---|---|
| 2008/0045056 A1* | 2/2008 | Collantes et al. | 439/131 |
| 2010/0258639 A1* | 10/2010 | Florek et al. | 235/492 |
| 2011/0273828 A1* | 11/2011 | Cochrane | 361/679.02 |

FOREIGN PATENT DOCUMENTS

JP 2007207520 A * 8/2007

* cited by examiner

*Primary Examiner* — Jayprakash N Gandhi
*Assistant Examiner* — Jerry Wu
(74) *Attorney, Agent, or Firm* — Altis Law Group, Inc.

(57) ABSTRACT

A grounding mechanism is used for a slide-type electronic device including a first housing and a second housing. The grounding mechanism includes a grounding tab for attachment to the first housing and an opening defined in the second housing. Two sidewalls are formed in the opening, and a conductive layer is coated on each sidewall. When the grounding tab is received in the opening, the grounding tab abuts against the conductive layer of the sidewalls for electronically connecting the first housing to the second housing.

9 Claims, 7 Drawing Sheets

GROUNDING MECHANISM FOR SLIDE-TYPE ELECTRONIC DEVICES

CROSS-REFERENCE TO RELATED APPLICATION

This application is related to co-pending U.S. patent application Ser. Nos. 12/844,978 and 12/844,982, entitled "GROUNDING MECHANISM FOR SLIDE-TYPE ELECTRONIC DEVICES", by Duan et al., which have the same assignee as the present application. The above-identified applications are incorporated herein by reference.

BACKGROUND

1. Technical Field

The disclosure relates to grounding mechanisms and, particularly, to a grounding mechanism used in a slide-type electronic device.

2. Description of Related Art

Slide-type electronic devices have multiple housing elements, such as two housing elements, of which one typically slides over the other to open/close the electronic device. Electromagnetic interference and electrostatic charges are easily produced in the two housings when in use. However, it is difficult to maintain a good grounding because of wear and tear over time from the two housing elements repeatedly moving relative to each other wears the plating on the grounding contact.

Therefore, there is room for improvement within the art.

BRIEF DESCRIPTION OF THE DRAWINGS

Many aspects of the grounding mechanism can be better understood with reference to the following drawings. The components in the drawings are not necessarily drawn to scale, the emphasis instead being placed upon clearly illustrating the principles of the present grounding mechanism. Moreover, in the drawings, like reference numerals designate corresponding parts throughout the several views.

DETAILED DESCRIPTION

The present grounding mechanism may be applied in many different slide-type electronic devices such as mobile phones, game devices, PDAs (personal digital assistant) and others. In an illustrated embodiment, the grounding mechanism is used in a slide-type mobile phone.

Figure 1:
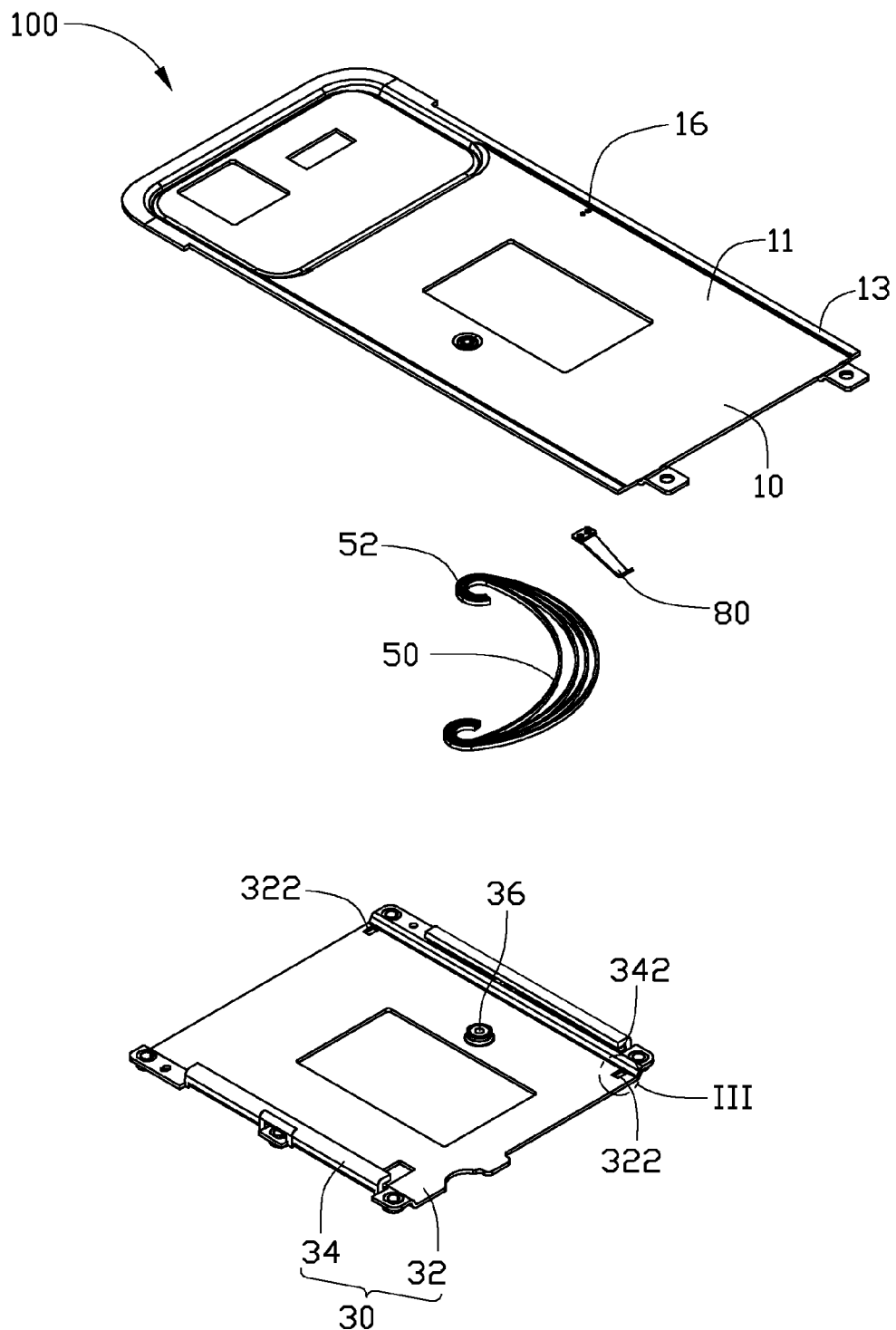
FIG. 1 is an exploded, isometric view of several portions of an electronic device using a grounding mechanism, which includes a grounding sheet, in accordance with an exemplary embodiment.
Figure 2:
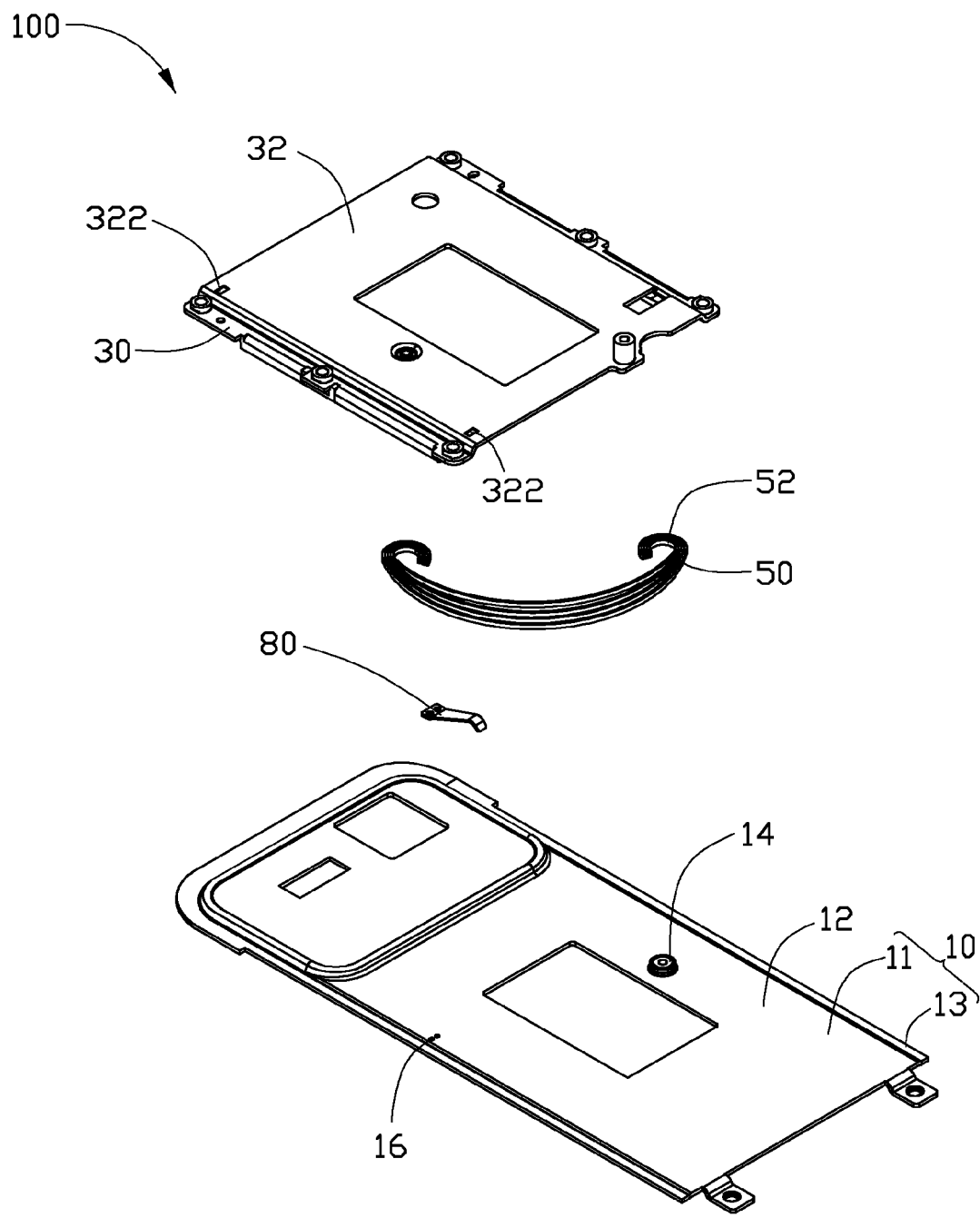
FIG. 2 is similar to FIG. 1, but shown from another aspect.

Referring to FIGS. 1 and 2, the electronic device 100 includes a first housing 10, a second housing 30, an elastic member 50 and a grounding tab 80. The elastic member 50 can drive the first housing 10 to slide relative to the second housing 30. The grounding tab 80 can conduct electromagnetic charges from the first housing 10 and the second housing 30 to a grounding pin of a printed circuit board (not shown) of the mobile phone 100.

The first housing 10 may be a cover of the electronic device 100. The first housing 10 includes a recessed portion 11 and two rail portions 13 extending from two opposite edge ends of the recessed portion 11. A first post 14 is formed on one surface 12 of the recessed portion 11. Two receiving holes 16 are defined in the surface 12.

Figure 3:
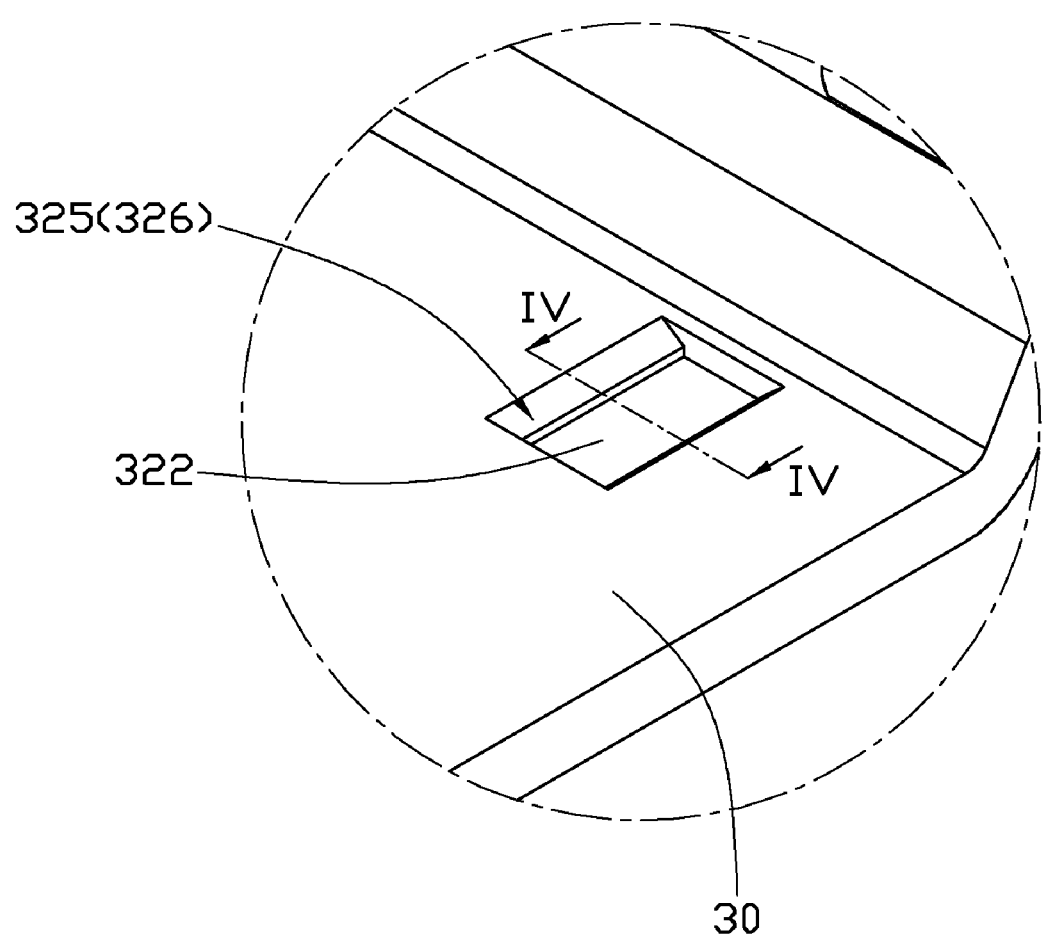
FIG. 3 is an enlarged view of one circled portion III of FIG. 1.
Figure 4:
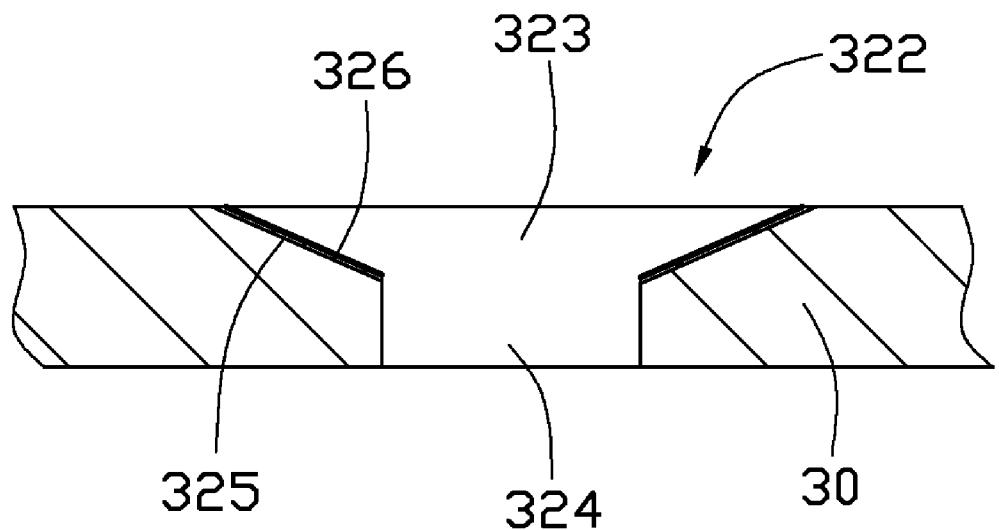
FIG. 4 is a cross-sectional view of FIG. 3 along line IV-IV thereof.

The second housing 30 is not as long as the first housing 10. The second housing 30 includes a main plate 32 and two sliding portions 34 at two opposite borders of the main plate 32. The two sliding portions 34 are generally U-shaped bars, and each defines a groove 342 corresponding to one of the two rail portions 13. The rail portions 13 can slide in the grooves 342. A second post 321 is formed on the main plate 32. Two openings 322 are defined in the main plate 32, and each is adjacent to one end of one (i.e., the same) slide portion 34. Referring to FIGS. 3 and 4, each opening 322 includes a first hole 323 with two tapered sides 325 sloping toward the center of opening 322 and a second hole 324 with parallel sides. A conductive layer 326 is coated on the tapered sidewalls 325 of the first hole 323. In this exemplary embodiment, the conductive layer 326 is a metallic layer made of gold. The gold layer is about 20-250 nm thick depending on cost considerations and wear resistant quality desired and or needed. In an exemplary embodiment, the gold layer is about 100-120 nm thick. This thickness of the gold layer may achieve a good balance between resistance wear and cost.

The elastic member 50 is made of a plurality of leaf springs, and includes a connecting portion 252 at two ends. The connecting portions 52 are configured to be respectively secured to the first housing 10 and the second housing 30. The elastic member 50 is designed to provide a predetermined torsion to drive the first housing 10 to slide relative to the second housing 30 in two predetermined positions.

Figure 5:
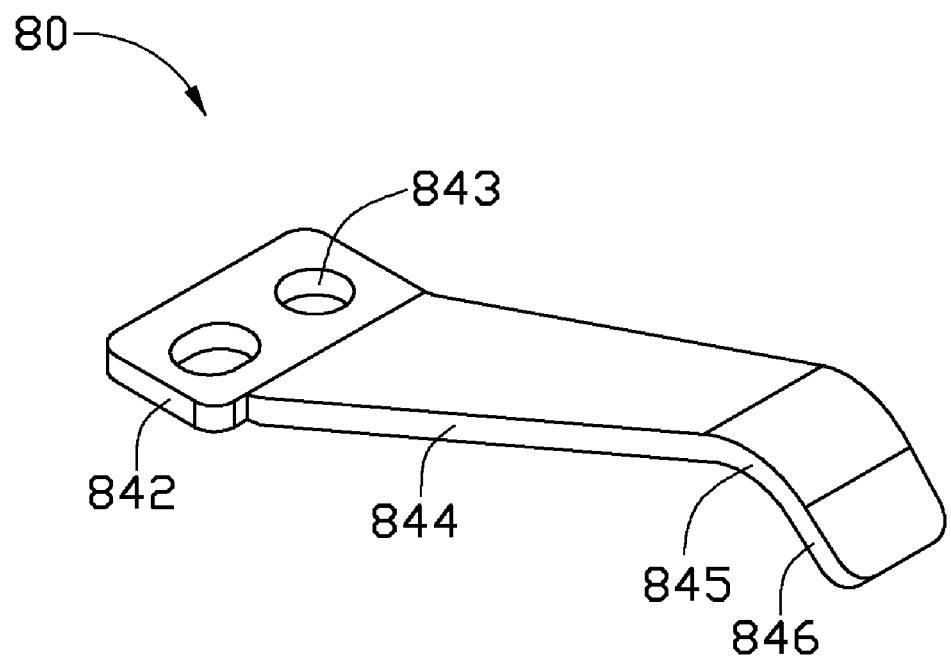
FIG. 5 is an enlarged view of the grounding tab.

Referring to FIG. 5, the grounding tab 80 is made of metal, and may be stamped or punched from a metal tab. The grounding tab 84 includes a seat portion 842, an angled portion 844, an arcuate portion 845 and an extending portion 846. The seat portion 842 defines two fastener holes 843 corresponding to the receiving holes 16 for mounting the grounding tab 80 to the first housing 10 with a fastener, such as bolts. Alternatively, the seat portion 842 may be fixed to the first housing 10 by way of, for example, welding. The angled portion 844 extends from one end of the seat portion 842. The arcuate portion 845 is connected between the angled portion 844 and the extending portion 846. When the grounding tab 80 is slid relative to the second housing 30 to a closed state or an open state, the arcuate portion 845 is alternatively received in one of the openings 322 and can be easily received in openings 322 due to the tapered leading and trailing sidewalls of openings 322. One part of the angled portion 844 and the extending portion 846 respectively abut against the conductive layer 326 to electronically connect the second housing 30. A top of the arcuate portion 845 is received in the second hole 324 of the opening 322, and does not substantially protrude from the opening 322.

Figure 6:
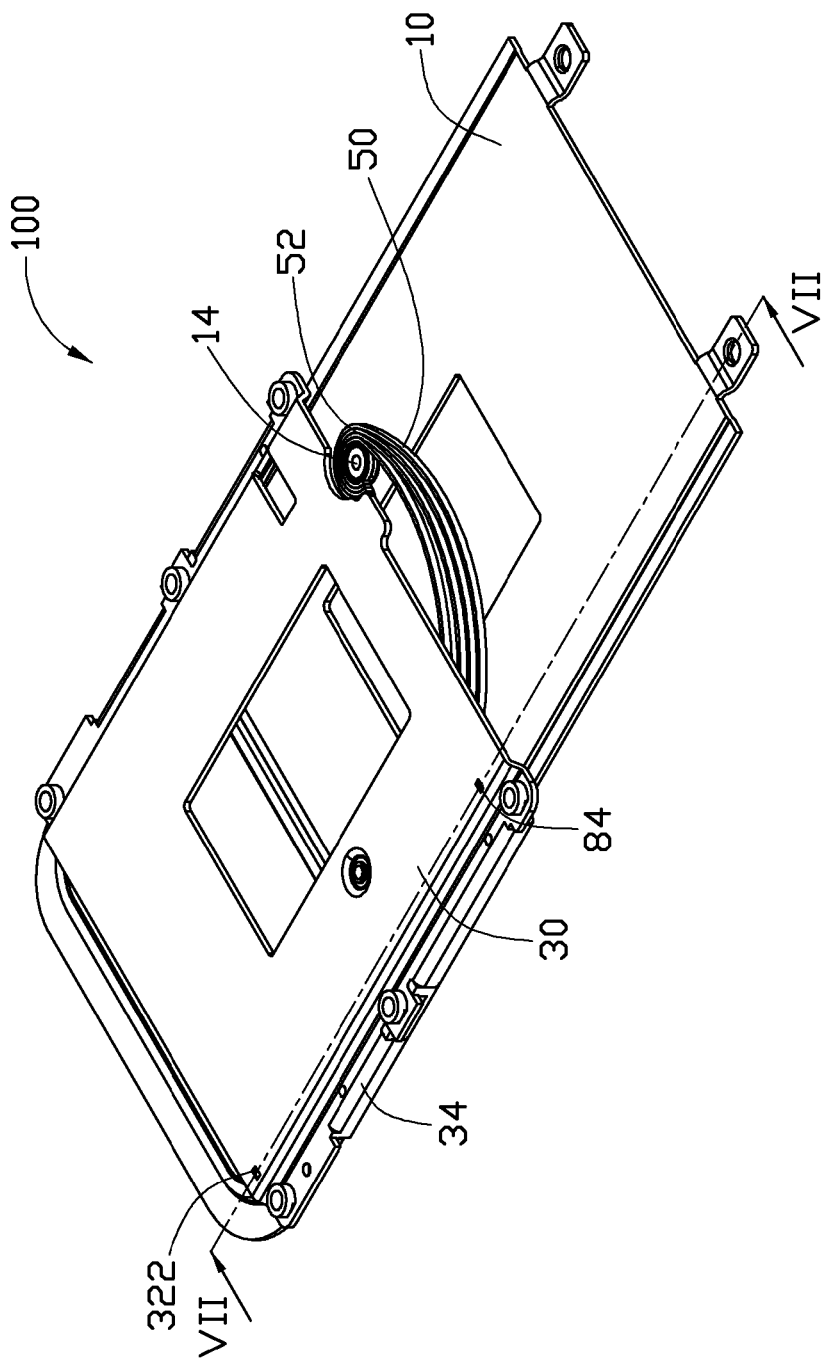
FIG. 6 is an assembled, schematic view of the portions of the electronic device.
Figure 7:
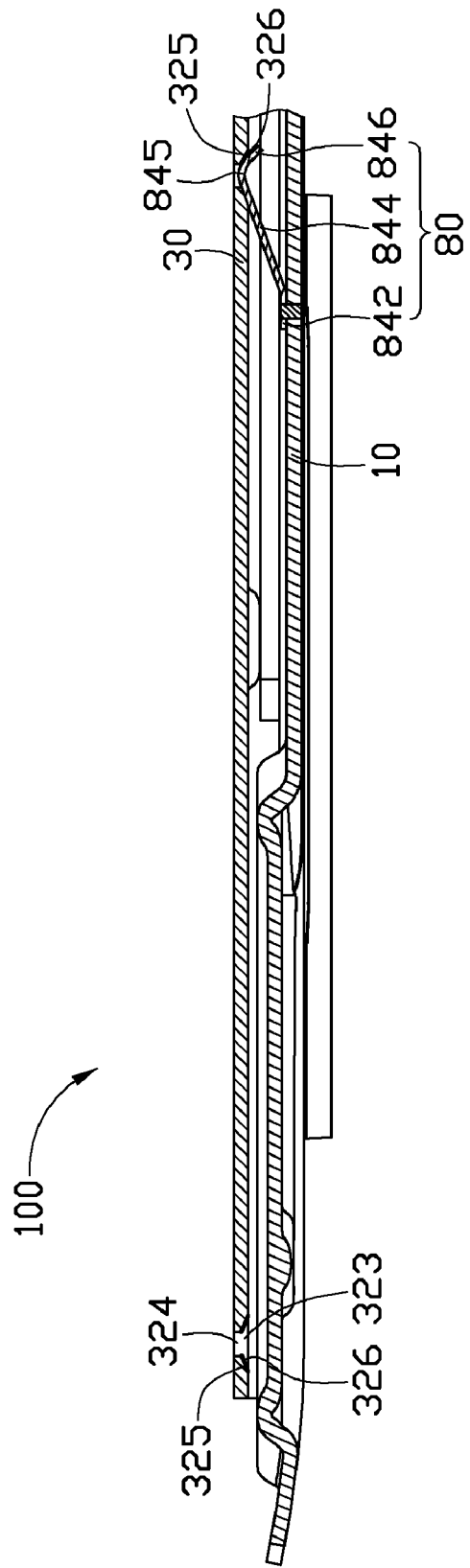
FIG. 7 is a cross-sectional view of FIG. 6 along line VII-VII thereof.

Referring to FIGS. 6 to 7, to assemble the electronic device 100, the connecting portions 52 are respectively secured to the first post 14 of the first housing 10 and the second post 36 of the second housing 30. The rail portions 13 are received in and can linearly slide within the slide grooves 342. The second housing 30 is slidably attached to the first housing 10. The arcuate portion 845 is received in one of the openings 322. One part of the angled portion 844 and the extending portion 846 respectively abut against the tapered conductive layer 326 to electronically connect the second housing 30. Thus, the portable electronic device 100 is at an open state.

When the electronic device 100 is to be driven from the opened position to the closed position, the second housing 30 slides relative to the first housing 10. The arcuate portion 845 of the grounding tab 84 slides on the second housing 30 until the arcuate portion 845 is received in the other opening 322. Therefore, the first housing 10, the conductive layer 326, the grounding tab 80, and the second housing 30 are electronically connected to a grounding pin of a main circuit board.

A significant advantage of the grounding mechanism is that the grounding tab is easily assembled to the first housing. This simplifies assembly of the electronic device so that costs are reduced. In addition, this structure may greatly reduce the wear of the conductive layer.

It is to be understood, however, that even though numerous characteristics and advantages of the present disclosure have been set forth in the foregoing description, together with details of assembly and function, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A grounding mechanism for a slide-type electronic device including a first housing and a second housing, the grounding mechanism comprising:
   a grounding tab for attachment to the first housing, the grounding tab including an angled portion, an arcuate portion and an extending portion, the arcuate portion being connected between the angled portion and the extending portion;
   an opening defined in the second housing, the opening including a first hole and a second hole, the first hole having two tapered sidewalls, the second hole having parallel sides connected to the tapered sidewalls, the tapered sidewalls sloping toward the center of the first hole, a conductive layer coated on each tapered sidewall;
   wherein when the grounding tab is selectively received in the opening, the angled portion and the extending portion of the grounding tab respectively abut against the conductive layers of the tapered sidewalls for electronically connecting the first housing to the second housing, the arcuate portion is received in the second hole.

2. The grounding mechanism as claimed in claim 1, wherein the grounding tab includes a seat portion extending from one end of the angled portion.

3. The grounding mechanism as claimed in claim 2, wherein the seat portion defines two fastener holes for mounting the grounding tab to the first housing with fasteners.

4. The grounding mechanism as claimed in claim 1, wherein each conductive layer is a gold layer about 20-250 nm thick.

5. An electronic device comprising:
   a first housing;
   a grounding tab for attachment to the first housing, the grounding tab including an angled portion, an arcuate portion and an extending portion, the arcuate portion being connected between the angled portion and the extending portion;
   a second housing slidably attached to the first housing, the second housing defining an opening including a first hole and a second hole, the first hole including tapered sides sloping toward the center of the first hole, the second hole having parallel sides connected to the tapered sides, a conductive layer coated on each tapered side of the first hole;
   wherein when the grounding tab is selectively received in the opening, the angled portion and the extending portion of the grounding tab respectively abut against the conductive layers in the first hole for electronically connecting the first housing to the second housing, and the arcuate portion of the grounding tab is received in the second hole.

6. The electronic device as claimed in claim 5, wherein the conductive layer is a gold layer about 20-250 nm thick.

7. The electronic device as claimed in claim 5, wherein the grounding tab includes a seat portion extending from one end of the angled portion, the seat portion defines two fastener holes for mounting the grounding tab to the first housing with fasteners.

8. An electronic device comprising:
   a first housing;
   a grounding tab for attachment to the first housing;
   a second housing slidably attached to the first housing, and defining two openings, each opening including a first hole and a second hole, the first hole including tapered sides sloping toward the center of the first hole, the second hole having parallel sides connected to the tapered sides, a conductive layer coated on each tapered side of the first hole;
   wherein when the second housing slides relative to the first housing to a closed state or an open state, the grounding tab selectively contacts a corresponding conductive layer in one of the openings, the angled portion and the extending portion of the grounding tab respectively abut against the conductive layers in the first hole for electrically connecting the first housing to the second housing, and the arcuate portion of the grounding tab is received in the second hole.

9. The grounding mechanism as claimed in claim 1, wherein the arcuate portion does not protrude from the second hole.

* * * * *